US008562849B2

(12) United States Patent
Bankaitis et al.

(10) Patent No.: US 8,562,849 B2
(45) Date of Patent: Oct. 22, 2013

(54) METHODS AND APPARATUS FOR EDGE CHAMFERING OF SEMICONDUCTOR WAFERS USING CHEMICAL MECHANICAL POLISHING

(75) Inventors: Jonas Bankaitis, Horseheads, NY (US); Michael John Moore, Corning, NY (US); Jeffery Scott Stone, Addison, NY (US); Paul Jeffrey Williamson, Corning, NY (US); Chunhe Zhang, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 612 days.

(21) Appl. No.: 12/627,306

(22) Filed: Nov. 30, 2009

(65) Prior Publication Data

US 2011/0130002 A1    Jun. 2, 2011

(51) Int. Cl.
*C03C 15/00*    (2006.01)

(52) U.S. Cl.
USPC .... 216/88; 438/692; 219/121.72; 219/121.73

(58) Field of Classification Search
None
See application file for complete search history.

(56) References Cited

U.S. PATENT DOCUMENTS

| | | | | |
|---|---|---|---|---|
| 5,214,261 | A * | 5/1993 | Zappella | 219/121.67 |
| 5,769,692 | A | 6/1998 | Pasch et al. | 451/41 |
| 6,315,649 | B1 * | 11/2001 | Hu et al. | 451/285 |
| 6,596,610 | B1 * | 7/2003 | Kuwabara et al. | 438/458 |
| 6,635,847 | B2 * | 10/2003 | Horsting | 219/121.71 |
| 6,664,503 | B1 * | 12/2003 | Hsieh et al. | 219/121.72 |
| 6,795,274 | B1 * | 9/2004 | Hsieh et al. | 360/135 |
| 6,840,841 | B2 | 1/2005 | Hakomori | 451/5 |
| 6,887,136 | B2 | 5/2005 | Smith | 451/57 |
| 6,921,455 | B1 | 7/2005 | Nakano et al. | 156/345.11 |
| 6,962,521 | B2 | 11/2005 | Mizushima | 451/44 |
| 6,984,167 | B2 | 1/2006 | Asahina | 451/41 |
| 7,176,528 | B2 | 2/2007 | Couillard et al. | 257/347 |
| 7,226,864 | B2 | 6/2007 | Koyata et al. | 438/690 |
| 7,267,784 | B2 | 9/2007 | Fang et al. | 252/79.1 |
| 7,435,662 | B2 | 10/2008 | Kobayashi | 438/455 |
| 7,510,974 | B2 | 3/2009 | Li et al. | 438/692 |
| 7,781,309 | B2 * | 8/2010 | Morita et al. | 438/459 |

(Continued)

FOREIGN PATENT DOCUMENTS

| | | | |
|---|---|---|---|
| DE | 10 2006 053 942 | 5/2008 | |
| EP | 1566830 | 8/2005 | H01L 21/02 |

(Continued)

OTHER PUBLICATIONS

Steigerwald, Chemical Mechanical Planarization of Microelectronic Materials, 2004, Wiley-VCH, p. 36-47, ISBN-10:0-471-13827-4.*

(Continued)

*Primary Examiner* — Binh X Tran
*Assistant Examiner* — David Cathey, Jr.
(74) *Attorney, Agent, or Firm* — Ryan T. Hardee (57) ABSTRACT

Methods and apparatus for processing edge portions of a donor semiconductor wafer include controlling chemical mechanical polishing parameters to achieve chamfering of the edges of the donor semiconductor wafer; and alternatively or additionally flexing the donor semiconductor wafer to present a concave configuration, where edge portions thereof are pronounced as compared to a central surface area thereof, such that the pronounced edge portions of the donor semiconductor wafer are preferentially polished against a polishing surface in order to achieve the chamfering.

9 Claims, 9 Drawing Sheets

(56) References Cited

U.S. PATENT DOCUMENTS

| | | | |
|---|---|---|---|
| 2005/0112893 A1 | 5/2005 | Koyata et al. | 438/692 |
| 2006/0024915 A1 | 2/2006 | Kobayashi | 438/455 |
| 2007/0048968 A1 | 3/2007 | Couillard et al. | 438/455 |
| 2008/0124930 A1 | 5/2008 | Lim et al. | 438/692 |
| 2009/0061593 A1 | 3/2009 | Gadkaree et al. | 438/458 |

FOREIGN PATENT DOCUMENTS

| | | | |
|---|---|---|---|
| WO | 02/066206 | 8/2002 | |
| WO | WO2009029264 | 3/2009 | H01L 21/762 |
| WO | 2011/053560 | 5/2011 | |

OTHER PUBLICATIONS

Tan, et al., "Low-Temperature Direct CVD Oxides to Thermal Oxide Wafer Bonding in Silicon Layer Transfer", *Electrochemical and Solid-State Letters*, 8 (1) G1-G4 (2005).

Strasbaugh Technical Publications Dept.—*Model 6EC Laboratory Planaizer Operation and Maintenance Manual*, Version 2.0, 1998 (Updated 1999), Chap 9.

U.S. Appl. No. 12/609,768, filed Oct. 30, 2009.

\* cited by examiner

METHODS AND APPARATUS FOR EDGE CHAMFERING OF SEMICONDUCTOR WAFERS USING CHEMICAL MECHANICAL POLISHING

BACKGROUND

The present invention relates to the manufacture of semiconductor-on-insulator (SOI) structures using an improved process for making same.

To date, the semiconductor material most commonly used in semiconductor-on-insulator structures has been silicon. Such structures have been referred to in the literature as silicon-on-insulator structures and the abbreviation "SOI" has been applied to such structures. SOI technology is becoming increasingly important for high performance thin film transistors, solar cells, and displays, such as active matrix displays. SOI structures may include a thin layer of substantially single crystal silicon on an insulating material.

Various ways of obtaining SOI structures include epitaxial growth of semiconductor material on lattice matched substrates. An alternative process includes the bonding of a single crystal silicon wafer to another silicon wafer on which an oxide layer of $SiO_2$ has been grown, followed by polishing or etching of the top wafer down to a thin layer of single crystal semiconductor. A further method includes ion-implantation, where either hydrogen or oxygen ions are implanted to form a weakened layer in a donor semiconductor wafer in order to separate (exfoliate) a thin semiconductor layer from the donor wafer and bond same to the insulator substrate.

Although many SOI manufacturing processes call for round single crystal (e.g., monocrystalline) semiconductor layers atop an insulator substrate, there are a number of applications for which non-circular semiconductor layers are required. For example, the provision of rectangular semiconductor layers (sometimes called "tiles") is becoming a requirement in the manufacture of displays, including organic light-emitting diode (OLED) displays and liquid crystal displays (LCDs), integrated circuits, photovoltaic devices, thin film transistor applications, etc.

The rectangular semiconductor layers must often be manufactured using very tight tolerances, crystal orientation accuracy, and strict form accuracy, including edge straightness, parallelism, and perpendicularity. The semiconductor layers should be free of contamination, mechanical damage (including subsurface damage), etc., which can erode or even catastrophically degrade the performance of a completed SOI structure. When rectangular semiconductor layers are formed using the aforementioned exfoliation/bonding technique, then it is desirable for the donor semiconductor wafer to be of a generally right parallelepiped configuration. Such a donor semiconductor wafer should adhere to stringent specifications, including having all four corners of at least one surface rounded, and all four straight edges of such end profiled (e.g., rounded in the manner of chamfering). These tight form requirements are desirable so that the donor semiconductor wafer can endure the processing stresses imposed by a significant number of re-uses (to produce many exfoliation layers and, thus, many SOI structures).

Rectangular donor semiconductor wafers may be produced from dedicated ingots or they may be machined from cylindrical semiconductor wafer stock (so-called round wafer stock). The commercial viability of the former is constrained by the availability of semiconductor ingots in a right parallelepiped configuration. Many semiconductor wafer manufacturers are unwilling to dedicate manufacturing resources to the production of rectangular semiconductor ingots because the market demand for such ingots is presently very small. The commercial viability of the latter approach (using round wafer stock) is more attractive at present because there is significant availability of 300 mm diameter round wafer stock.

The use of round wafer stock to produce rectangular semiconductor layers for use in SOI structures requires that the round wafer stock be processed into rectangular donor semiconductor wafers. A variety of methods have been employed to machine rectangular donor semiconductor wafers out of round stock. Diamond dicing round stock into a rectangular structure has been the traditional process due to its ability to hold strict form accuracy. Diamond dicing processing, however, leaves micro-cracks and chips on the straight edges and corners of the resultant rectangular donor wafer. In addition, the diamond dicing process does not readily produce rounded corners in the rectangular donor wafer. This severely limits the viability of re-use of the donor wafer. Indeed, as the donor semiconductor wafer is exposed to significant thermal and mechanical stress during the formation of an SOI structure, the subsurface damage created by diamond dicing would likely lead to chipping or breakage of the donor wafer when exposed to multiple re-uses.

Mechanical dicing a round stock ingot into a rectangular structure followed by extensive edge forming (edge grinding and polishing) has also been employed. While effective, such mechanical dicing and post processing add considerable fixed and variable costs to the overall process of producing SOIs, which limits the commercial viability of the technique. Indeed, edge grinding and polishing technology, and related equipment, are prohibitively expensive and the associated consumables needed to carry out such edge treatments must be purchased and managed, often requiring additional expensive preparation and control systems. Further, extensive edge forming processes reduce the usable surface area of the resultant semiconductor layer of the SOI. Finally, such edge forming processes often only conceal subsurface damage and, thus, fracture strength remains compromised.

Although the manufacturing processes for making SOI structures are maturing, the cost of producing such structures and the final products employing them is driven in part by the ability to obtain suitable rectangular donor semiconductor wafers at commercially viable prices. Accordingly, it is desirable to continue to advance the technologies associated with producing donor semiconductor wafers in order to control the cost of manufacturing SOI structures.

SUMMARY

Embodiments described herein are directed to the use of round wafer stock to produce rectangular donor semiconductor wafers. A promising process for producing a rectangular structure from a round stock ingot employs water-guided laser dicing technology. Rectangular donor semiconductor wafers produced using water-guided laser dicing meet the dimensional and form factor requirements, as well as damage-free edges and corners. The ability to produce damage-free edges and corners is very important because when such damage is present, it is the primary source of cracks and crack propagation in the donor wafer during the SOI manufacturing process. Therefore, water-guided laser dicing is an extremely attractive process. There is, however, at least one significant problem with using water-guided laser dicing to form a rectangular donor wafer; namely, the introduction of beads of reformed, melted semiconductor material (so-called "slag"), which appears in a discontinuous pattern along each edge of the rectangular donor wafer. If left in place, the accumulated slag will cause incomplete contact between the bonding surface of the donor semiconductor wafer and the insulator substrate during bonding and exfoliation. This will result in an inferior or completely inoperable SOI structure.

One or more embodiments disclosed herein may include the application of CMP methodology to a donor semiconductor wafer of arbitrary geometry (round, non-round, rectangular, etc.) such that slag-free, damage-free, tightly radiused edge profiles are created. The CMP process employs three basic elements: a polishing pad in which the characteristics thereof (abrasiveness, composition, etc.) are selected to suit the polishing application; a particle-laden slurry; and the subject to be polished (in this context, the donor semiconductor wafer). The donor semiconductor wafer is affixed to a chuck or head in such a way as to allow controlled pressing of a damaged surface thereof against the compliant polishing pad, which has been saturated with, and continuously fed by, a steady supply of the slurry.

In accordance with one or more embodiments, substrate topography is reduced, global planarity established, and corner/edge shaping achieved by simultaneous interfacial chemical and mechanical interactions which may be controlled by strategic choice of such consumables as polishing pad, slurry particle properties and associated chemistry including additives. Selection of the polishing pad, slurry particle chemistry, slurry concentration, slurry flow rate, slurry additives, polishing down force, and kinematics, temperature, polishing duration, are used in particular combinations to control material removal and effect surface restoration and corner/edge shaping.

In accordance with one or more alternative or further embodiments, corner/edge shaping may be achieved by employing process parameters to flex the donor semiconductor wafer in such a way as to direct polishing down force to the areas thereof where slag is known to be concentrated. The polishing may be any of the known methods whether strictly mechanical or combinations of mechanical and chemical, such as a CMP process.

In accordance with one or more embodiments disclosed herein, methods and apparatus for processing a donor semiconductor wafer include: rotating the donor semiconductor wafer; rotating a polishing pad, applying a polishing slurry to the polishing pad, and pressing the donor semiconductor wafer and the polishing pad together, such that a surface and edge portions of the donor semiconductor wafer are against the polishing pad; and selecting one or more parameters of the polishing conditions such that the edge portions of the donor semiconductor wafer are chamfered.

In accordance with one or more further embodiments disclosed herein, methods and apparatus may include: flexing the donor semiconductor wafer to present a concave configuration, where edge portions thereof are pronounced as compared to a central surface area thereof; rotating the donor semiconductor wafer with respect to a polishing surface and applying pressure such that the pronounced edge portions of the donor semiconductor wafer are against the polishing surface; and controlling the flexion of the donor semiconductor wafer, the rotation, and the pressure such that the edge portions of the donor semiconductor wafer are chamfered. The polishing surface may include a polishing pad and a polishing slurry, such as in a CMP process.

Other aspects, features, advantages, etc. will become apparent to one skilled in the art when the description of the embodiments herein is taken in conjunction with the accompanying drawings.

BRIEF DESCRIPTION OF THE DRAWINGS

For the purposes of illustrating the various aspects of the embodiments herein, there are shown in the drawings forms that are presently preferred, it being understood, however, that the invention is not limited to the precise arrangements and instrumentalities shown.

DETAILED DESCRIPTION

For ease of presentation, the following discussion will at times be in terms of SOI structures. The references to this particular type of SOI structure are made to facilitate the explanation of the embodiments herein and are not intended to, and should not be interpreted in a limiting sense. The SOI abbreviation is used herein to refer to semiconductor-on-insulator structures in general, including, but not limited to, semiconductor-on-glass (SOG) structures, silicon-on-insulator (SOI) structures, and silicon-on-glass (SiOG) structures, which also encompasses silicon-on-glass-ceramic structures.

Figure 1:
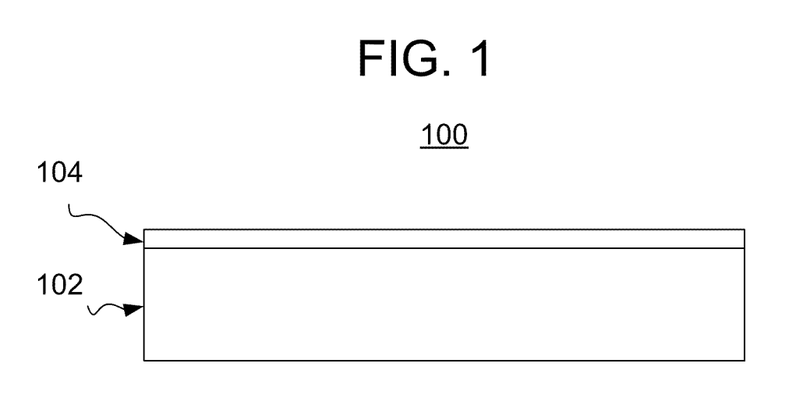
FIG. 1 is a simplified side view illustrating the structure of an SOG device in accordance with one or more embodiments described herein.

With reference to the drawings, wherein like numerals indicate like elements, there is shown in FIG. 1 an SOI structure (in particular, an SOG structure) 100 in accordance with one or more embodiments described herein. The SOG structure 100 includes an insulator substrate, such as a glass or glass ceramic substrate 102, and a semiconductor layer 104. The SOG structure 100 has application for use in displays, including organic light-emitting diode (OLED) displays and liquid crystal displays (LCDs), integrated circuits, photovoltaic devices, thin film transistor applications, etc.

The semiconductor material of the layer 104 may be in the form of a substantially single-crystal material. The term "substantially" is used in describing the layer 104 to take account of the fact that semiconductor materials normally contain at least some internal or surface defects either inherently or purposely added, such as lattice defects or a few grain boundaries. The term substantially also reflects the fact that certain dopants may distort or otherwise affect the crystal structure of the semiconductor material.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The production of the SOG 100 involves the use of a donor semiconductor wafer to produce an exfoliated semiconductor layer therefrom, where the exfoliated semiconductor layer is bonded to the glass substrate 102. The exfoliated semiconductor layer is post processed to produce the high quality semiconductor layer 104. A bonding/exfoliation process in which a donor semiconductor wafer is used to produce the SOG structure 100 may include: (i) exposing a donor surface of the donor semiconductor wafer to ion implantation to create weakened layer therein; (ii) bringing the bonding surface of the donor wafer into contact with the glass substrate 102; (iii) applying temperature and voltage to the donor semiconductor wafer and the glass substrate 102 to facilitate bonding therebetween (pressure may also be applied); and (iv) separating the glass substrate 102 and the thin exfoliation layer of semiconductor material from the donor semiconductor wafer. U.S. Pat. No. 7,176,528 provides details of such a bonding/exfoliation process, the entire disclosure of which is hereby incorporated by reference.

Figure 2:
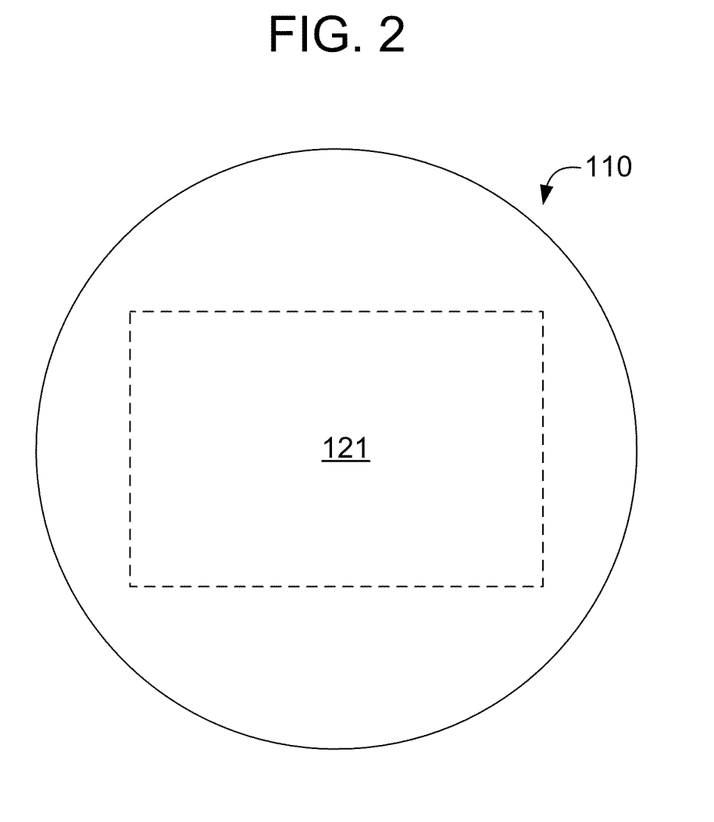
FIG. 2 is en end-view of a round stock ingot intended for use in producing a rectangular donor semiconductor wafer in accordance with one or more embodiments described herein.

With that context, reference is made to FIG. 2, which illustrates an end view of a round piece of wafer stock 110. Embodiments described herein are directed to the use of the round wafer stock 110 to produce a rectangular donor semiconductor wafer 120.

Figure 3:
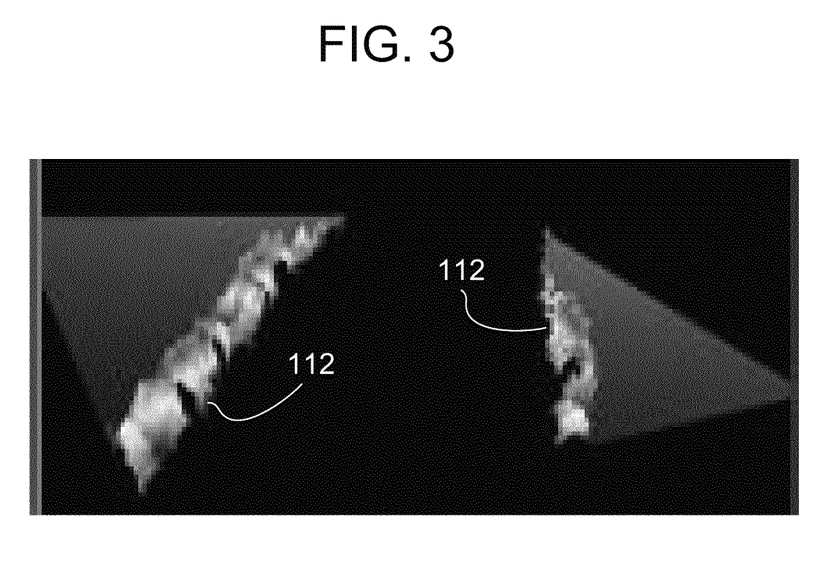
FIG. 3 illustrates the undesirable characteristics of slag at the edges of the rectangular donor semiconductor wafer that has been cut using water-guided laser dicing.

A promising process for producing a rectangular donor semiconductor wafer 120 from a round stock ingot 110 employs water-guided laser dicing technology. Rectangular donor semiconductor wafers 120 produced using water-guided laser dicing meet the dimensional and form factor requirements discussed above, as well as damage-free edges and corners. The ability to produce damage-free edges and corners is very important because when such damage is present, it is the primary source of cracks and crack propagation in the donor wafer 120 and/or the resultant semiconductor layer 104 during the SOG manufacturing process. Therefore, water-guided laser dicing is an extremely attractive process Reference is now made to FIG. 3, which is a white light interferometer image of a straight channel formed in the round piece of wafer stock 110 using water-guided laser dicing. There is at least one significant problem with using water-guided laser dicing to form the rectangular donor wafer 120; namely, the introduction of beads of reformed, melted semiconductor material (so-called "slag") 112, which appears in a discontinuous pattern along each edge of the resulting rectangular donor wafer 120. If left in place, the accumulated slag 112 will cause incomplete contact between the bonding surface of the donor semiconductor wafer 120 and the glass substrate 102 during bonding and exfoliation. This will result in an inferior or completely inoperable SOG structure 100.

Figure 4:
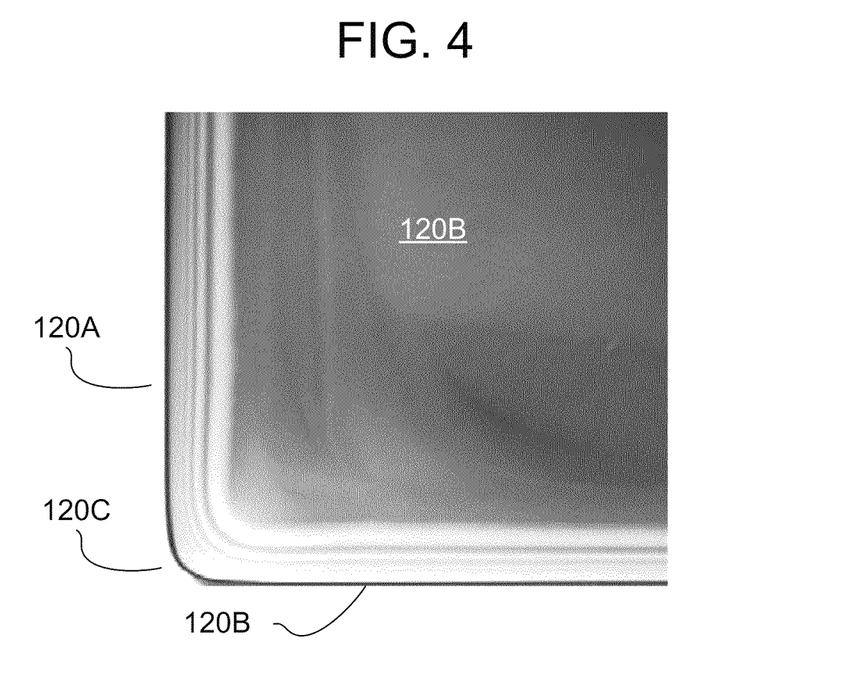
FIG. 4 illustrates certain desirable edge and corner characteristics of the rectangular donor semiconductor wafer, namely the peripheral edges being rounded via chamfering (where Newton rings may be used to identify the characteristics of the chamfering)

With reference to FIG. 4, the peripheral edges (such as adjacent edges 120A, 120B) of the donor semiconductor wafer 120 must not only be free of the slag 112, but must include specific physical characteristics. Indeed, all four straight edges (only two edges 120A, 120B being shown) should be profiled (e.g., rounded via chamfering). In addition, the four corners (only corner 120C being shown) should be rounded. Again, these physical characteristics of the edges/corners of the donor semiconductor wafer 120 are desirable so that the wafer 120 can endure the processing stresses imposed by the bonding/exfoliation process (and a significant number of re-uses) to produce many exfoliation layers and, thus, many SOG structures 100.

Experimentation has been conducted to explore ways in which the slag 112 may be removed from edges 120A, 120B of the donor semiconductor wafer 120, including a variety of edge treatments, such as mechanical chamfering, edge grinding, edge polishing and chemical etching. Such experimentation included application of a conventional apparatus for carrying out chemical mechanical polishing (CMP) to remove the slag 112 by concentrating the polishing down force on the area of the donor semiconductor wafer 120 where slag was known to exist (e.g., specifically the edges). Such experimentation was accomplished through the use of a laboratory scale polisher employing a wafer carrier of the appropriate geometry to which the substrate was affixed. The experimentation yielded surprisingly good results.

Existing CMP polishing protocols call for aggressive removal of material, which increases the risk of removing too much material from the donor semiconductor wafer 120. Concurrently, such aggressive protocols increase the risk of breakage due to associated handling of much thinner (and likely more fragile) wafers 120. Also, if not properly considered, application of conventional CMP techniques may be expensive. A given CMP set-up typically includes a rotating polishing pad (having certain mechanical characteristics), a slurry (having certain abrasive characteristics), and a rotating chuck or head to press the donor semiconductor wafer 120 against the polishing pad and slurry. In accordance with many conventional CMP techniques, multiple polishing pads are needed, which requires either: a single piece of equipment with multiple platens (each with a different polishing pad), manual process steps to change the polishing pad on a piece of equipment having only one platen, or multiple pieces of equipment, each with a different platen and polishing pad. Either approach adds cost to the manufacturing process and adversely impacts the commercial viability of the SOI structure and end-use application.

Conventional CMP protocols also do not remove material uniformly across the surface of the donor semiconductor wafer 120. The state of the art for round semiconductor wafer surface non-uniformities (standard deviation/mean removal thickness) is typically 5-10% of the material thickness removed. As more of the semiconductor material is removed, the variation in the thickness correspondingly worsens.

It has been discovered, however, that through careful control of the parameters used in a CMP process, the slag 112 at the edges 120A, 120B of a rectangular donor semiconductor wafer 120 (produced by water-guided laser dicing technology) may be successfully removed, and proper corner and edge characteristics (rounded corners 120C and chamfered edges 120A, 120B) may be obtained. These CMP parameters may include one or more of: polishing down force, polisher kinematics (e.g., platen and head speeds), slurry characteristics (e.g., concentration, particle size, additives, and flow rate), polishing pad characteristics, method of restraining the polishing substrate, temperature and cycle duration.

It has also been discovered that through controlled manipulation of the donor semiconductor wafer 120 any polishing mechanism may be used (not necessarily CMP) to remove the slag 112 and chamfer the edges 120A, 120B). In this regard, process parameters were formulated to flex the donor semiconductor wafer 120 in such a way as to direct polishing down force to the edge/corner areas thereof where slag 112 is known to be concentrated.

In order to more fully appreciate the processing embodiments herein, it is believed that more context as to an exemplary manufacturing process for producing the SOG 100 (particularly multiple SOGs 100) would be beneficial.

Figure 5:
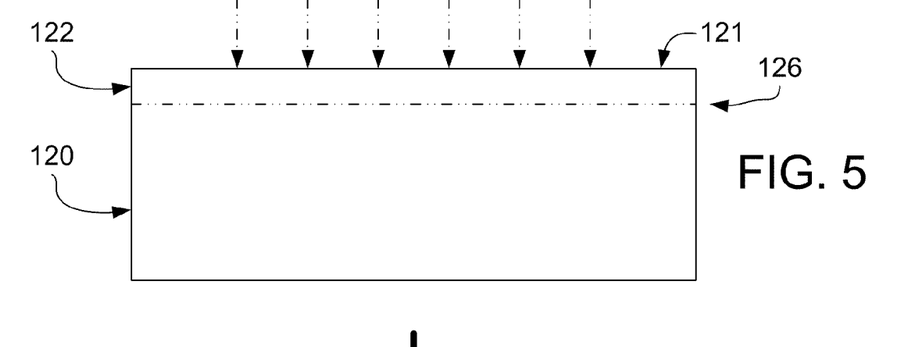
FIGS. 5-7 are simplified schematic diagrams illustrating intermediate structures formed using processes described herein to produce the SOG device of FIG. 1.
Figure 6:
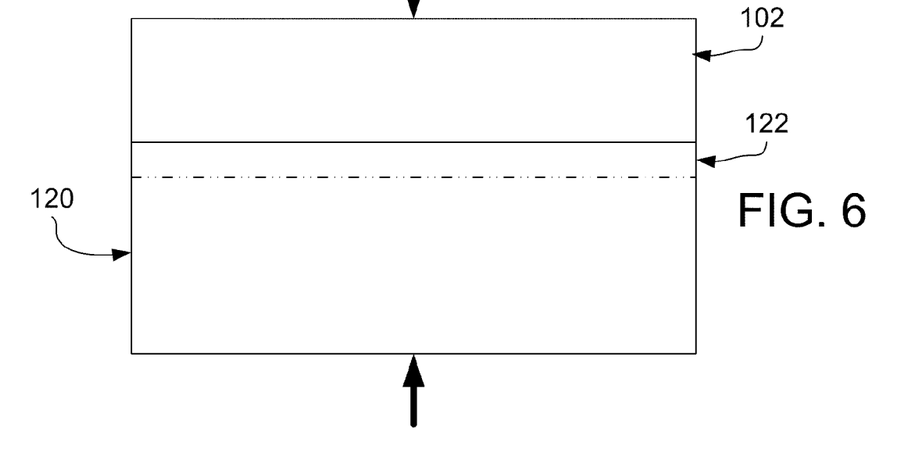
Figure 7:
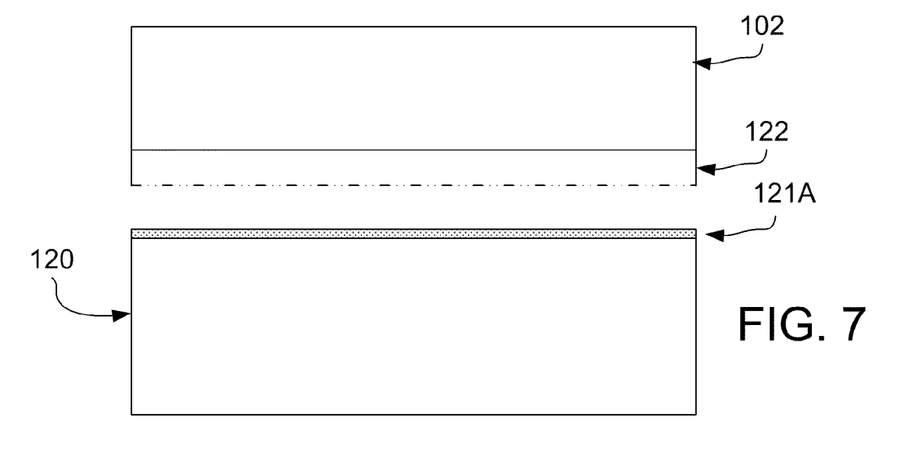

Reference is now made to FIGS. 5-7, which illustrate intermediate structures that may be formed in order to produce the SOG structure 100. Turning first to FIG. 5, the bonding surface 121 of the donor semiconductor wafer 120 is prepared, such as by polishing, cleaning, etc. to produce a relatively flat and uniform bonding surface 121 suitable for bonding to the glass or glass-ceramic substrate 102.

An exfoliation layer 122 is created by subjecting the bonding surface 121 to one or more ion implantation processes to create a weakened region (diagrammatically illustrated by dashed line 126) below the bonding surface 121 of the donor semiconductor wafer 120. Although the embodiments described herein are not limited to any particular method of forming the exfoliation layer 122, one suitable method dictates that the bonding surface 121 of the donor semiconductor wafer 120 may be subject to a hydrogen ion implantation process to at least initiate the creation of the weakened region 126 in the donor semiconductor wafer 120.

With reference to FIG. 6, the glass substrate 102 may be bonded to the bonding surface 121 of exfoliation layer 122 using any known or hereinafter developed technology. For example, the glass substrate 102 may be bonded to the exfoliation layer 122 using a thermal bonding process. Alternatively, the glass substrate 102 may be bonded to the exfoliation layer 122 using an electrolysis process (also referred to herein as an anodic bonding process). A basis for a suitable electrolysis bonding process may be found in U.S. Pat. No. 7,176,528. Portions of this process are discussed below.

The glass substrate 102 is brought into direct or indirect contact with the bonding surface 121 of the donor semiconductor wafer 120 to achieve the arrangement schematically illustrated in FIG. 6. The resulting intermediate structure is thus a stack, including the bulk material layer of the donor semiconductor wafer 120, the exfoliation layer 122, and the glass substrate 102.

Prior to or after the contact, the structure(s) comprising the donor semiconductor wafer 120, the exfoliation layer 122, and the glass substrate 102 are heated. The glass substrate 102 may be heated to a higher (or lower) temperature than the donor semiconductor wafer 120 and exfoliation layer 122. The glass substrate 102 and the donor semiconductor wafer 120 may be taken to a temperature within about 50-150 degrees C. of the strain point of the glass substrate 102.

Next, a voltage is applied across the intermediate assembly, for example with the donor semiconductor wafer 120 at the positive electrode and the glass substrate 102 the negative electrode. Pressure may also be applied to press the donor semiconductor wafer 120 against the glass substrate 102. The intermediate assembly is held under the above conditions for some time (e.g., approximately 1 hour or less), the voltage is removed and the intermediate assembly is allowed to cool to room temperature.

With reference to FIG. 7, prior to, during and/or after cooling the donor semiconductor wafer 120 and the glass substrate 102 are separated, which may include some peeling if they have not already become completely free, to obtain a glass substrate 102 with the relatively thin exfoliation layer 122 formed of the semiconductor material of the donor semiconductor layer 120 bonded thereto. The separation of the exfoliation layer 122 may be accomplished via fracture of the donor semiconductor wafer 120 along the weakened region 126 due to thermal and internal pressure stresses. Alternatively or in addition, mechanical stresses or energy, such as water jet pressure or cutting (or other mechanical contact or cutting forces), tension or shear forces, or chemical etching may be used to initiate and/or facilitate the separation of the exfoliation layer 122 from the donor semiconductor wafer 120.

The newly exposed cleaved surface (and underlying layer) 121A of the donor semiconductor wafer 120 may exhibit ion contamination and excessive surface roughness or damage from the implantation and exfoliation processes.

Figure 8:
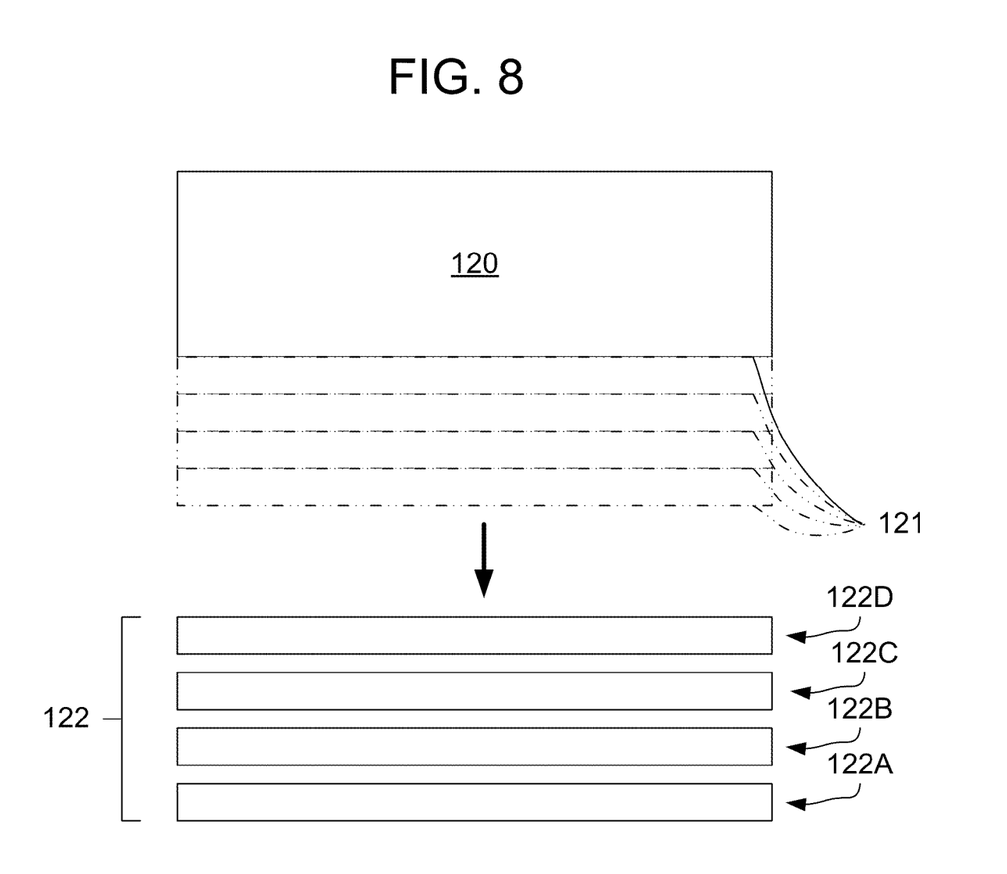
FIG. 8 is a simplified diagram illustrating the re-use of a donor semiconductor wafer to form a number of the SOG devices of FIG. 1.

With reference to FIG. 8, it is desirable to form many such SOG structures 100 in a manufacturing process, either for separate products, or for an integrated device in which multiple SOG structures are needed. In either case, one way to produce multiple SOG structures 100 is to cleave (separate or exfoliate) a number of thin exfoliation layers 122A, 122B, 122C, etc. of semiconductor material from the donor semiconductor wafer 120 during a process in which the respective bonding surfaces 121 of the donor semiconductor wafer 120 are bonded to respective glass substrates 102. After the removal (e.g. exfoliation, cleaving or separation) of a first exfoliation layer 122A of semiconductor material from the donor semiconductor wafer 120, a cleaved, exfoliated surface (and underlying damaged, contaminated layer) 121A of the remaining portion of the donor semiconductor wafer 120 is refreshed to a subsequent, suitable bonding surface 121, having a relatively ion contamination and damage-free state. The subsequent bonding surface 121 is then used for a subsequent bonding and exfoliation process for the transfer and bonding of a second exfoliation layer 122B to a second glass substrate 102. This process is repeated (refinishing the cleaved surface 121A of the donor semiconductor wafer 120) for the transfer and bonding of third, fourth exfoliation layers 122C, 122D, etc. to respective glass substrates 102.

For re-use it may be desirable to return the surface of the donor semiconductor wafer 120 remaining after exfoliation (the cleaved or exfoliated surface) to a relatively damage-free state—at least to a state indistinguishable from an un-used (prime surface) of a donor semiconductor wafer 120. This has been done by removing a certain thickness of the donor semiconductor wafer, which is contaminated with ions and damaged due to the implantation and exfoliation (separation) processes, for example, by way of CMP process techniques. Details of how to return the surface of the donor semiconductor wafer 120 to a damaged free state following ion implantation/exfoliation (i.e., refreshing the cleaved surface of the donor semiconductor wafer 120) may be found in co-pending U.S. patent application Ser. No. 12/609,768, filed Oct. 30, 2009, the entire disclosure of which is hereby incorporated by reference in its entirety.

In accordance with one or more embodiments herein, the parameters used in a CMP process are carefully controlled in order to remove the slag 112 at the edges 120A, 120B of the rectangular donor semiconductor wafer 120, and produce proper corner and edge characteristics (rounded corners 120C and chamfered edges 120A, 120B). These CMP processing parameters may be applied before, during and/or after subjecting the donor semiconductor wafer 120 to one or more CMP processing cycles to remove the damage and ion contamination from the cleaved surface (and underlying layer) 121A and produce a refreshed bonding surface 121 suitable for producing a further SOG structure 100.

Figure 9:
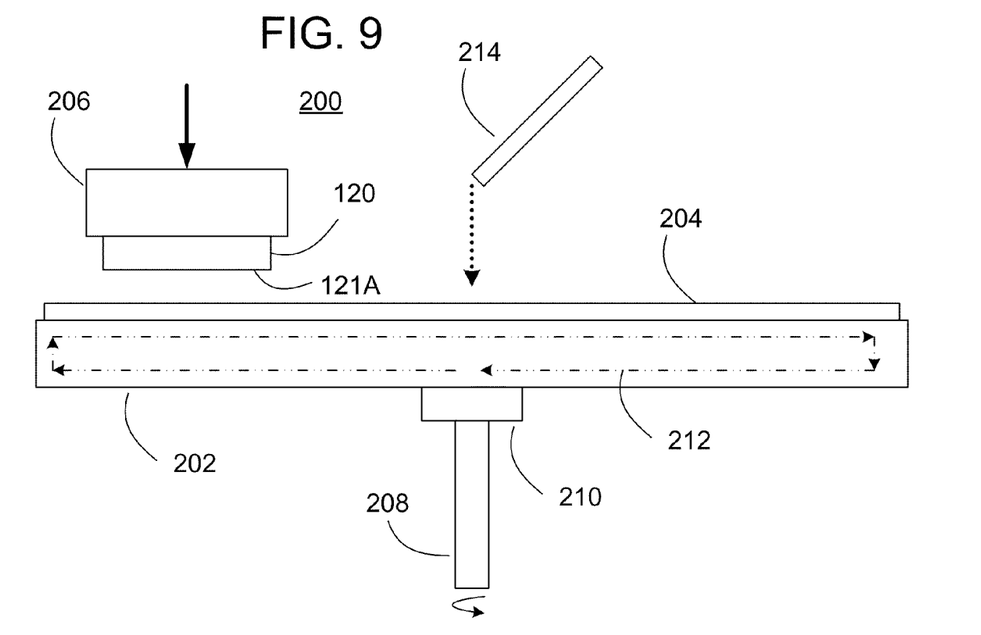
FIG. 9 is a schematic diagram of a piece of equipment suitable for carrying out CMP processing in accordance with one or more embodiments described herein.

With reference to FIG. 9, a suitable system 200 is illustrated for carrying out CMP processing embodiments to: (i) remove the slag 112 at the edges 120A, 120B of the rectangular donor semiconductor wafer 120; (ii) produce proper corner and edge characteristics; and/or (iii) remove the damaged cleaved surface (and underlying layer) 121A from the donor semiconductor wafer 120. The system includes a polishing platen 202, a polishing pad 204, and a chuck or head 206. The polishing platen 202 rotates at a controlled rate in response to a shaft 208 and rotary union 210. A suitable controllable source of rotational drive (not shown) provides the required rotational torque to the shaft 208.

The polishing platen 202 may contain internal webbing or channels through which a heating/cooling fluid 212 may flow. For example, tempered water may flow at considerable volume (about 10-20 liters per minute) through the webbing in the platen. The temperature of the water may be controlled (such as to about 26° C.), such that a maximum polishing temperature may be maintained (such as not to exceed about 39° C.) at the surface of the polishing pad 204. The temperature of the surface of the polishing pad 204 may be measured via an optical pyrometer (not shown) trained thereon throughout the polishing process. It has been discovered that by maintaining a high cooling fluid temperature, one can force the non-linear removal rate versus polishing time curve to the high end of removal rate more quickly. There are also advantages to suppressing the cooling fluid temperature. For example, one may elect to suppress the chemical contribution of CMP to material removal, as this often results in flatter polished substrates at the expense of efficiency. However, cooling fluid temperature changes also result in polishing platen shape changes that are the result of polishing platen thermal expansion and contraction.

The polishing pad 204 may be of any suitable construction, although it has been discovered that advantages may be achieved when it includes certain characteristics that will be discussed later herein.

A source 214 of slurry to the polishing pad 204 is strategically located to deliver adjustable rates thereof. The characteristics of the slurry will also affect the quality and character of the edge chamfering of the donor semiconductor wafer 120. For example, the particle type, particle size distribution, concentration and chemical buffering (typically expressed as pH) may affect the chamfering. As a general rule, (all other polishing conditions being held constant) the higher the slurry pH, the more chemically aggressive the process, the higher the removal rate, and the more aggressive the resulting edge chamfering for silicon polishing.

As will be discussed in more detail below, a rinsing liquid (such as deionized water) may also be delivered through the source 214, or through a separate independent source (not shown), to the polishing pad 204.

Figure 10:
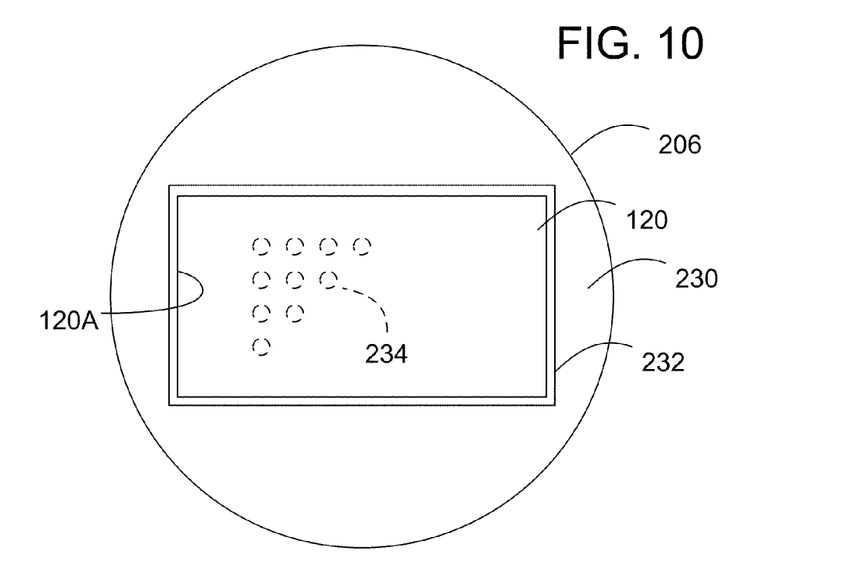
FIG. 10 is a schematic diagram showing some characteristics of a chuck or head for holding the donor semiconductor wafer in the equipment of FIG. 9.

The donor semiconductor wafer 120 (which has been produced using water-guided laser dicing) is held by the chuck or head 206 and is pressed thereby against the polishing pad 204 during operation of the equipment 200. The head 206 may also rotate via appropriate motor and linkage (not shown). As shown in FIG. 10, the donor semiconductor wafer 120 is of rectangular cross-section, and given that the wafer 120 was diced the surface and edges thereof would not be chamfered—indeed, they would exhibit the characteristics of such dicing, such as slag accumulations. The head 206 may include a rigid block 230 to which a composite material template 232 is mounted. The composite material template 232 includes a bottom layer and a plastic or fiberglass top layer. The form factor of the donor semiconductor wafer 120 (e.g. a rectangular relief) is machined through the top layer exposing the bottom layer. By way of example, the material template 232 may feature a 15-inch diameter, 0.170-inch nominal thickness disc into which a rectangular pocket with corner relief has been machined through the top layer. By way of example, the disc may be a material obtained from Franklin Fibre-Lamitex Corporation, such as a two-layer material with a bottom layer and a plastic or fiberglass top layer. The construction of the material template 232 may be such that the recessed area is formed in a size and shape corresponding closely to the donor semiconductor wafer 120 when the two composite layers are joined with one another.

The recessed area of the material template 232 may include a vacuum mechanism 234, which operates to control an amount and nature of a force drawing the donor semiconductor wafer 120 into the recess. By way of example, the recessed area of the material template 232 may include a plurality of apertures through the bottom plate thereof, which apertures are in fluid communication with a vacuum pump or other source (not shown). The vacuum pump or other source may be computer controlled to assist in the control of the CMP processing parameters. Thus, the transport of varying amounts vacuum, air, water, etc. may be achieved during operation. The vacuum force is used to secure the donor semiconductor wafer 120 to the head 206 during polishing, concurrently fluid (such as air) may be transported through the apertures in the bottom plate, thereby creating a back pressure that can be manipulated to flex the substrate. Further details on the structure and operation of a suitable vacuum mechanism 234 may be found in the following publication: Strasbaugh Technical Publications Department. Model 6EC Laboratory Planarizer Operation and Maintenance Manual, Version 2.0 (June 1998, updated Feb. 1, 1999).

The vacuum mechanism may be set to produce some desired amount of vacuum drawing the donor semiconductor wafer 120 against a back plate of the material template 232. For example, the vacuum may be between about 0 and −3 psi in order to attain a desired flexing of the donor semiconductor wafer 120. Additionally, it may be desirable to provide some amount of back pressure, such as between about 1-3 psi, in combination with the vacuum to obtain the desired flexing. The vacuum set point (possibly combined with the back pressure set point) contribute to a desirable flex of the donor semiconductor wafer 120, where the central area of the wafer 120 is concave as viewed in FIG. 10, and the edges 120A, 120B, etc. are pronounced toward the polishing pad 204. Alternatively or additionally, the recessed area of the material template 232 may include a profiled back plate behind the donor semiconductor wafer 120, which itself may be concave, thereby aiding in the desired flexing of the donor semiconductor wafer 120. It is noted that the ability to control the flexing of the donor semiconductor wafer 120 such that the edges 120A, 120B, etc. are pronounced toward the polishing pad 204 permits control of the amount and location of material removal from the wafer 120 in order to produce the chamfering. In this regard, it is understood that such flexing apparatus and process may be employed with other polishing techniques (not just CMP), such as any of the known mechanical polishing techniques, in order to achieve the chamfering.

The composite material template 232 may also include a capillary-action pad bottom layer (e.g., a suede-based finish). When the recessed area of the material template 232 is wetted with clean deionized water thereby wetting the capillary action bottom layer, and the backside of the donor semiconductor wafer 120 is gently pressed into the recess against the wet bottom layer, capillary action holds the wafer 120 vertically in place in the recessed area in the direction that the wafer 120 and the polishing pad 204 are pressed together. The sides of the recessed area in the upper layer serve to restrain the donor semiconductor wafer 120 laterally in the axis of rotation.

In order to achieve the desired processing results for the donor semiconductor wafer 120, it is critical that the CMP process be carefully controlled and that processing parameters be carefully selected. This is not a matter of routine optimization of parameters and predictable results. Rather, it has been discovered through significant experimentation and analysis that certain processing parameters should be maintained and others varied in a cyclical process.

In general, the CMP process for edge chamfering is conducted in sequential stages, where certain process parameters are strategically varied in a sequence of steps. By using a single pad (or just 2 pads), the entire process can be automated providing significant reductions in cycle time and labor spent on changing pads compared to the multi-pad labor intensive conventional CMP processes. A number of examples are discussed below, which illustrate the use of the CMP process to achieve edge chamfering, including some edge chamfering extremes that may be achieved through CMP process parameter selection and control.

Example 1

This example is intended to illustrate an extreme in which the CMP parameters of polishing duration, slurry type, and down force may be adjusted in order to produce a very gradual, rolling edge chamfer. It is noted that in this example, the controlled flexing of the donor semiconductor wafer 120 using back pressure, vacuum, etc. was not employed.

The CMP process includes the primary steps of: (a) a material removal step by rotating the polishing pad 204 (via the platen 202), rotating the donor semiconductor wafer 120 (via the head 206), applying the polishing slurry to the polishing pad 204 (via the source 214), and pressing the donor semiconductor wafer 120 and the polishing pad 204 together; and (b) a rinsing step, where the polishing pad 204 and the donor semiconductor wafer 120 continue rotation and contact, but the application of the polishing slurry is discontinued in favor of applying a rinsing fluid to the polishing pad 204.

Significant consideration has been given to the properties and characteristics of the polishing pad 204. In general, polishing pads used in CMP processes are polymeric, but vary widely in such physical properties as hardness, compressibility, permeability, nap thickness, pore structure, surface contour, and rebound rate, leading to varying performance characteristics. The polishing pad 204 is a significant element in the present CMP embodiments because, by means of its pore structure, it acts as a conduit for the near simultaneous distribution of slurry chemicals and expulsion of resulting polishing by-products. The selection of polishing pad product for specific applications of CMP is therefore important to the achievement of desired process ends. It has been discovered that, as a general rule (and with all other polishing conditions being held constant), the higher the compressibility of the material of the polishing pad 204, the more compliant the pad will be and the more aggressive edge chamfering via CMP will be. Advantages may be achieved when the polishing pad 204 is of the felt-based, polyurethane impregnated type.

Figure 11:
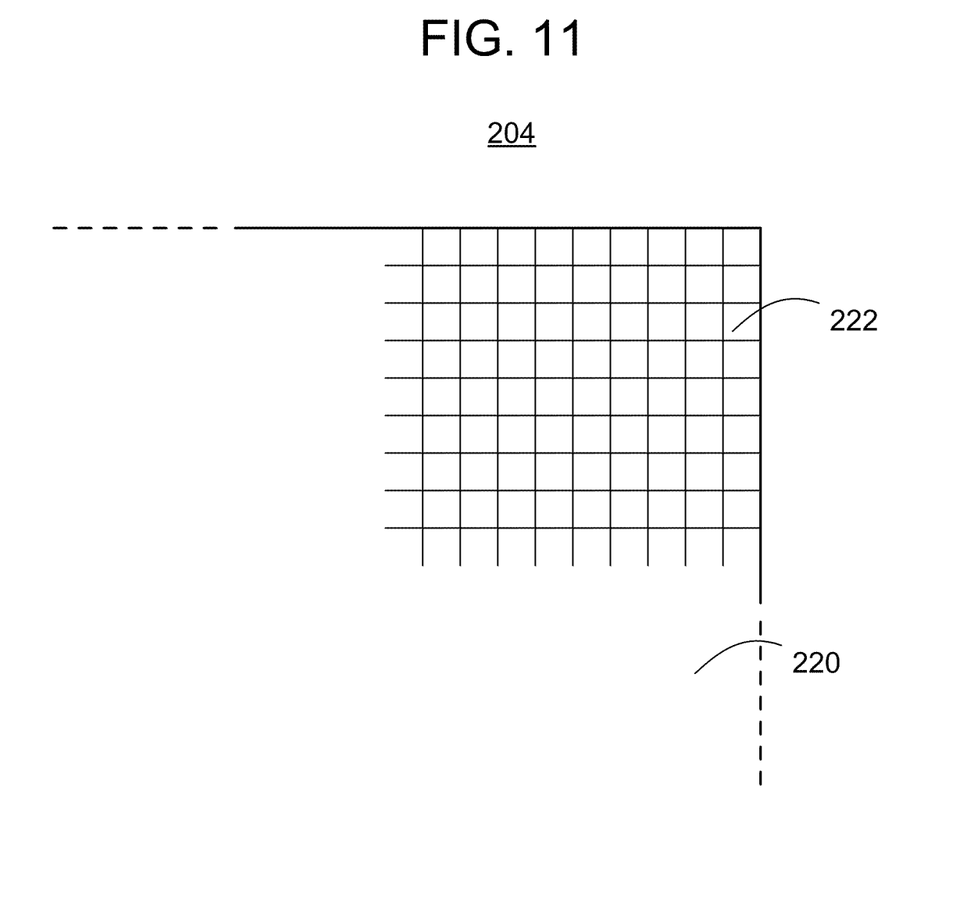
FIG. 11 is a schematic illustration of certain desirable characteristics of a polishing pad suitable for use with the equipment of FIG. 9.

In accordance with this example, the polishing pad 204 may be of about 1.25 mm nominal thickness, relatively low compressibility by pad standards (such as about 2.9% compressibility), considerable hardness (about 85 Asker C durometer), and low air permeability resistance. With reference to FIG. 11, the surface 220 of the polishing pad 204 that engages the donor semiconductor wafer 120 is preferably deeply grooved or channeled 222. By way of example, the grooves 222 may be in a perpendicular, cross-hatched arrangement in a Cartesian coordinate plane. It has been found that advantageous results may be obtained when the grooves 222 are about 1 mm or more deep and the cross-hatching is on the order of about 21 mm×21 mm. A suitable polishing pad 204 may be obtained from Rohm-Haas Incorporated, presently sold as SUBA 840 PAD 48"D PJ;XA25 (supplier material number 10346084). Alternative patterns for the groove 222 are possible, such as diamond-shaped grooves, spiral-shaped grooves, radially and/or circumferentially extending grooves, etc.

The CMP sequence may be initiated (a startup stage) by executing an initial "ramp-up" process, in which the polishing pad 204 and the donor semiconductor wafer 120 are each rotated (e.g., both clockwise), applying the polishing slurry to the polishing pad 204, and pressing the donor semiconductor wafer 120 and the polishing pad 204 together. During startup, the polishing pad 204 is wetted and saturated at about 500 ml/min with a colloidal silica slurry with a mean particle size of about 60-80 nm (such as 70 nm), a 50% by weight SiO2, and 50% by weight deionized water, and a pH in the 8.0-9.0 range. The slurry is diluted 20:1 with deionized water to produce an "as dispensed" mixture. A suitable slurry product may be obtained from Nalco, part number 2360 colloidal silica polishing slurry.

The flow rate of the slurry should be selected to accomplish the polishing objectives for the given parameters of the process and system 200. Such parameters include, for example, the size of the polishing platen 202, the size of the polishing pad 204, and/or the surface area of the cleaved surface 121A. Indeed, a relatively small diameter platen 202 and polishing pad 204, such as those found on laboratory-scale machines require far less slurry than relatively larger diameter platens 202 and polishing pads 204, typically associated with industrial-scale polishers. Further, the surface characteristics (e.g., the groove pattern, frequency, and groove depth) of the polishing pad 204 may significantly affect the minimum slurry flow rate. Indeed, deep and/or high concentrations of grooves in the polishing pad 204 tend to channel significantly more slurry away from the polishing zone as compared with shallow and/or low concentrations of grooves. As an alternative or addition to employing higher or lower flow rates of slurry, increasing or decreasing an additional, separate flow of deionized water may be employed. It is contemplated that the flow rate of the slurry should fall in the range of 250-2500 ml/min.

The platen 202 (and thus the polishing pad 204) rotational speed may be ramped to values of about 40-70 rpm, while the polishing head 206 (and thus the donor semiconductor wafer 120) rotational speed may be ramped to about 15-25 rpm. The down force (the pressure at which the donor semiconductor wafer 120 and the polishing pad 204 are pressed together) may be ramped to a moderate level of about 10-20 psi, such as about 16 psi. The startup stage may last about 30 seconds.

The startup described above may transition seamlessly into a material removal stage of considerable duration (e.g., about 1800 seconds). For example, this may represent a "first" polishing step conducted using some of the process settings described in the startup stage above.

Next, a rinsing step is conducted, where the polishing pad 204 and the donor semiconductor wafer 120 continue rotation and contact, but the application of the polishing slurry is discontinued in favor of applying deionized water to the polishing pad 204. The flow rate of the deionized water may be on the order of about 5600 ml/min. During this rinsing stage, the down force may be significantly reduced as compared with the prior polishing steps. For example, the pressure at which the donor semiconductor wafer 120 and the polishing pad 204 are pressed together may be between about 1-3 pounds per square inch, such as about 2 psi. The rotational speeds of the polishing pad 204 and the donor semiconductor wafer 120 may be maintained at about 50-70 rpm, and about 15-25 rpm, respectively. By way of example, this rinsing step may be conducted for about 10-20 seconds, such as about 15 seconds.

In a next or second polishing step, the down force may be decreased with respect to the prior polishing step (such as to about 12 psi). The rotational speeds of the polishing pad 204 and the donor semiconductor wafer 120 may be maintained at about 50-70 rpm, and about 15-25 rpm, respectively. In this polishing step, the same colloidal silica slurry as in the prior polishing step may be employed. By way of example, this polishing step may be conducted for about 180 seconds.

Next, another rinsing step, substantially similar to the earlier rinsing step may be conducted. The polishing pad 204 and the donor semiconductor wafer 120 continue rotation and contact, and application of the deionized water to the polishing pad 204 is conducted. As in the prior rinsing step, during this rinsing step, the down force may be significantly reduced as compared with the prior polishing steps, such as about 2 psi. By way of example, this rinsing step may also be conducted for about 15 seconds.

Next, a third polishing step is carried out. The down force is elevated as compared with the prior rinsing step, such as to about 3 psi. This polishing step may be considered a finishing polishing step, where the type of slurry is changed. In particular, the polishing pad 204 is wetted and saturated at about 1000 ml/min with a colloidal silica slurry with a mean particle size of about 30-40 nm (such as 35 nm), and a mixture of 5% by weight $SiO_2$, 1% by weight $NH_4OH$, 1% by weight Cellulose, and 93% by weight deionized water. The pH may be in the 10-11 range, such as about 10.8. The slurry may be diluted 40:1 with deionized water to produce an as dispensed mixture. A suitable slurry product may be obtained from Glanzox, part number 3950 colloidal silica polishing slurry. The rotational speeds of the polishing pad 204 and the donor semiconductor wafer 120 may be maintained at about 50-70 rpm, and about 15-25 rpm, respectively. This polishing step may be conducted for about 180 seconds.

Next, another rinsing step, substantially similar to the earlier rinsing steps may be conducted. The polishing pad 204 and the donor semiconductor wafer 120 continue rotation and contact, and application of the deionized water to the polishing pad 204 is conducted. As in the prior rinsing step, during this rinsing step, the down force may be significantly reduced as compared with the prior polishing steps, such as to about 2 psi. This rinsing step may also be conducted for about 15 seconds.

Optional, additional processing stages may be employed to further effect the edge chamfering. For example, another interval of rinsing step may be conducted, where: (i) the interval lasts between about 50-70 seconds (such as 60 seconds), (ii) the pressure at which the semiconductor donor wafer 120 and the polishing pad 204 are pressed together is between about 1-3 pounds per square inch, (iii) speeds of rotation of the polishing pad 204 and the semiconductor donor wafer 120 are between about 25-45 rpm (such as 35 rpm), and (iv) the rinsing fluid is a rinsing agent. The rinsing agent may include a secondary chemistry (e.g., a pH of about 10.8), including chemical components that act to reduce surface tension between the wafer 120 and the polishing pad 204. This chemistry passivates the wafer 120, creating a hydrophylic surface conducive to downstream cleaning. By way of example, a Rodelene rinse agent composed of silica, isopropyl alcohol, and ethylene glycol in deionized water manufactured by Rohm-Haas Electronic Materials CMP Incorporated may be employed. A final rinsing step may be conducted, where: (i) the interval lasts between about 10 seconds, (ii) the pressure at which the semiconductor donor wafer 120 and the polishing pad 204 are pressed together is minimized, (iii) speeds of rotation of the polishing pad 204 and the semiconductor donor wafer 120 are between about 25-45 rpm, and (iv) the rinsing fluid is water.

Figure 12A:
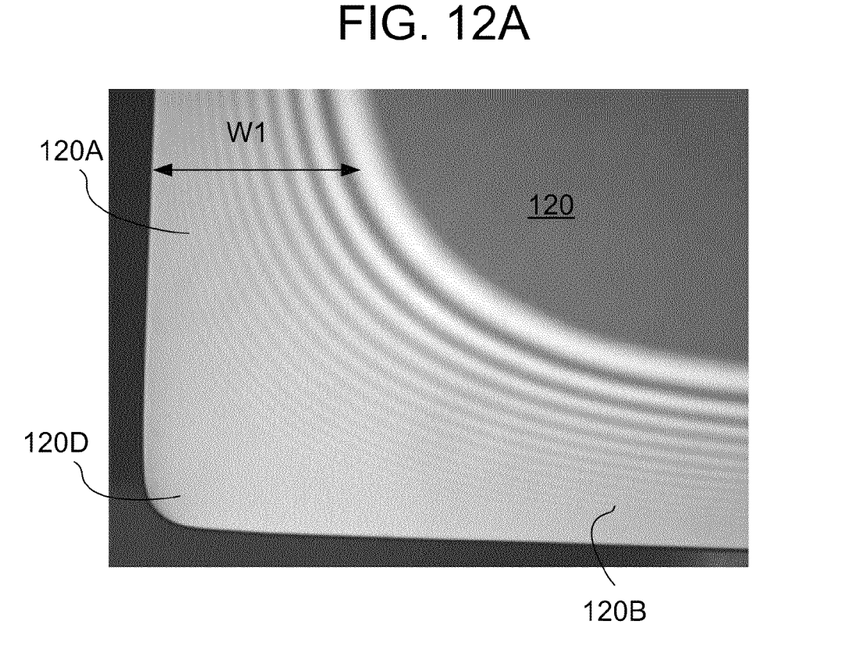
FIGS. 12A and 12B illustrate edge and corner characteristics of two rectangular donor semiconductor wafers produced in response to differing polished processes (variations in slurry, duration and down force) using the equipment of FIG. 9.

Reference is now made to FIG. 12A, which is a close-up view of the peripheral edges 120A, 120B of the donor semiconductor wafer 120. Such edges 120A, 120B include profiled, rounded chamfering and a rounded corner 120D. The relative width W1 of the edge chamfer on the semiconductor wafer 120 is very wide, including many Newton rings. As will be demonstrated in a later example, this width W1 is significantly wider than the width of the edge chamfer resulting from alternative CMP processing parameters.

Example 2

This example is intended to illustrate an opposite extreme as compared with Example 1, in which the CMP parameters of polishing duration, slurry type, and down force may be adjusted in order to produce a very steep edge chamfer. It is noted that in this example, the controlled flexing of the donor semiconductor wafer 120 using back pressure, vacuum, etc. was not employed.

In this example, the same polishing pad 204 may be employed as was used in Example 1, however, a different polishing slurry is used. In particular, the polishing pad 204 is wetted and saturated at about 500 ml/min with a fumed silica slurry with a mean particle size of about 100 nm, a dilution profile (as dispensed onto the pad 204) of about 12% by weight of $SiO_2$, 1% by weight KOH, and 87% by weight of deionized water; and a pH of about 11.0. A suitable slurry product may be obtained from Fujimi, part number PL4219 fumed polishing slurry. In all other ways, the same "ramp-up" process as in Example 1 was used. The ramp-up process then transitioned into a first polishing step of about 120 seconds (significantly shorter than in Example 1). The polishing step was followed by a rinsing step, where the process parameters were the same as those of Example 1.

In a next or second polishing step, the down force was decreased with respect to the prior polishing step (such as to about 8 psi). The rotational speeds of the polishing pad 204 and the donor semiconductor wafer 120 were maintained at about 50-70 rpm, and about 15-25 rpm, respectively. In this polishing step, a colloidal silica slurry was employed with a mean particle size of about 60-80 nm (such as 70 nm), a 50% by weight $SiO_2$, and 50% by weight deionized water, and a pH in the 8.0-9.0 range. The slurry is diluted 20:1 with deionized water to produce an "as dispensed" mixture. A suitable slurry product may be obtained from Nalco, part number 2360 colloidal silica polishing slurry. By way of example, this polishing step was conducted for about 210 seconds, followed by another rinsing step of the same process parameters as prior rinsing steps.

Next, a third polishing step is carried out. The down force was further reduced as compared with the prior polishing steps to about 3 psi. In this polishing step, the type of slurry is changed to the 1000 ml/min colloidal silica slurry with a mean particle size of about 30-40 nm (such as 35 nm), a mixture of 5% by weight SiO2, 1% by weight NH4OH, 1% by weight Cellulose, and 93% by weight deionized water, and pH of 10.8. The slurry may be diluted 40:1 with deionized water to produce an as dispensed mixture. Recall that this slurry product may be obtained from Glanzox, part number 3950 colloidal silica polishing slurry. The rotational speeds of the polishing pad 204 and the donor semiconductor wafer 120 were maintained at about 60 rpm, and about 20 rpm, respectively. This polishing step was conducted for about 30 seconds (substantially shorter than in Example 1), and was followed by another rinsing step of the same process parameters as prior rinsing steps.

The additional processing stages mentioned in Example 1 were also carried out to further effect the edge chamfering.

Figure 12B:
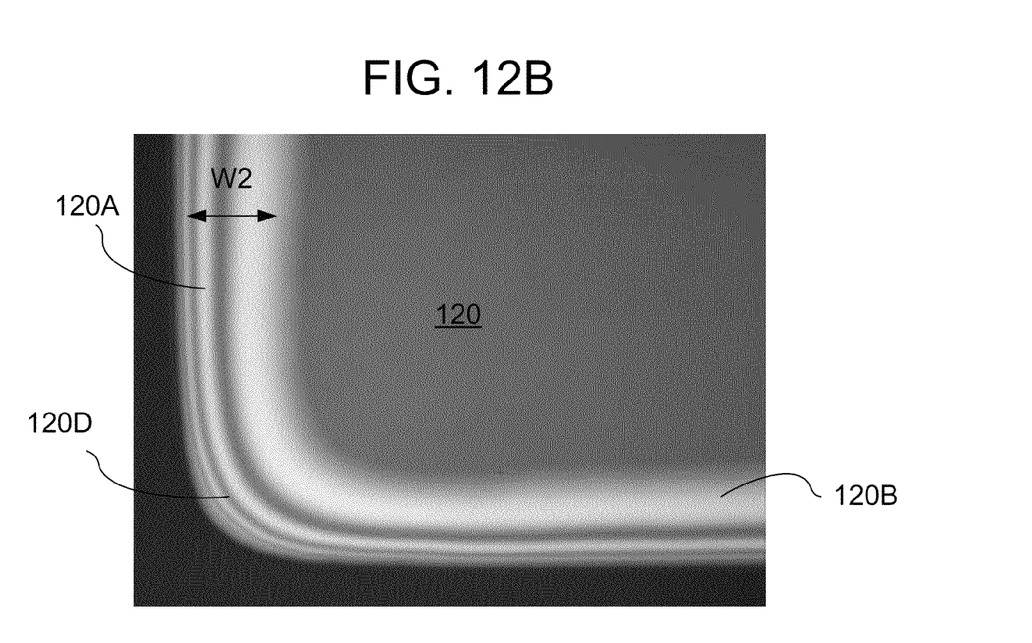

Reference is now made to FIG. 12B, which is a close-up view of the peripheral edges 120A, 120B of the donor semiconductor wafer 120. Such edges 120A, 120B include profiled, rounded chamfering and a rounded corner 120D. The relative width W2 of the edge chamfer on the semiconductor wafer 120 is very narrow, including relatively few Newton rings (as compared to the width W1 of FIG. 12A). The results of Example 1 and Example 2 demonstrate the significant variation that may be achieved in the characteristics of the edge chamfer by controlling various CMP process parameters.

Example 3

This example includes two parts, intended to illustrate the effect that the slurry choice alone may have on the characteristics of the edge chamfer. In each part of the experiment, identical ramp-up, polishing, and rinsing steps were performed, the only difference being the choice of slurry in each part of the experiment.

In both parts of this example, the same polishing pad 204 may be employed as was used in Example 1. In the first part of the experiment, however, the polishing pad 204 is wetted and saturated at about 500 ml/min with a fumed silica slurry with a mean particle size of about 100 nm, a dilution profile (as dispensed onto the pad 204) of about 12% by weight of SiO2, 1% by weight KOH, and 87% by weight of deionized water, and a pH of about 11.0. Recall that a suitable slurry product may be obtained from Fujimi, part number PL4219 fumed polishing slurry. In all other ways, the same "ramp-up" process as in Example 1 was used. The ramp-up process then transitioned into a first polishing step of about 300 seconds (significantly shorter than in Example 1), followed by a rinsing step of about 30 seconds.

In the second part of the experiment, the polishing pad 204 is wetted and saturated at about 500 ml/min with a colloidal silica slurry with a mean particle size of about 60-80 nm (such as 70 nm), a mixture of 50% by weight Si02, and 50% by weight deionized water, and a pH in the 11.5-12.5 range. The slurry may be diluted 20:1 with deionized water to produce an as dispensed mixture. A suitable slurry product may be obtained from Nalco, part number 2358 colloidal silica polishing slurry. In all other ways, the same "ramp-up" process as in Example 1 was used. The ramp-up process then transitioned into a first polishing step of about 300 seconds, followed by a rinsing step.

The differences in the edge chamfer characteristics obtained in each part of the experiment were significant. In particular, a relatively gradual, rolling edge chamfering characteristic was obtained using the second slurry, as compared with a sharp characteristic using the first slurry. Thus, in this example, it has been demonstrated that by changing the slurry to include a different particle type (fumed silica for the first slurry versus colloidal silica for the second slurry), a different particle size (100 nm for the first slurry and 75 nm for the second slurry), and a different concentration (12% for the first slurry versus less than 2% for the second slurry, as diluted and mixed in each case), different chamfering characteristics may be obtained.

Example 4

Figure 13A:
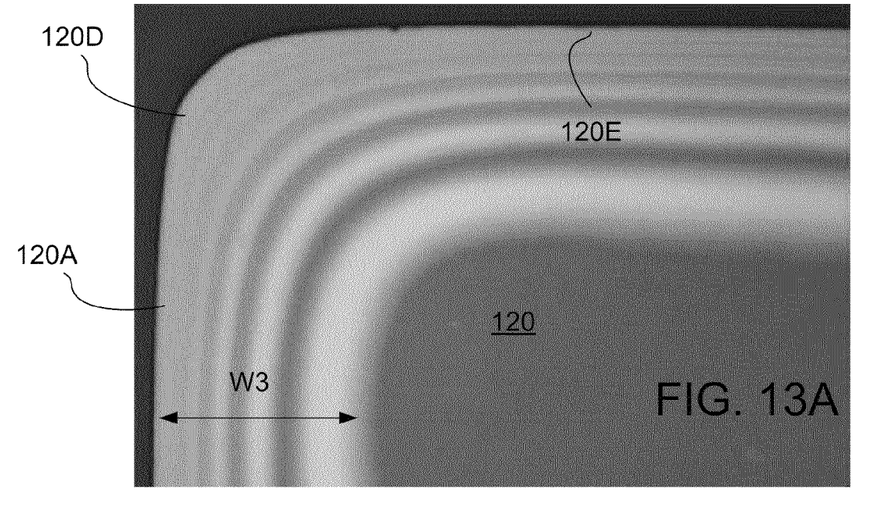
FIGS. 13A and 13B illustrate edge and corner characteristics of two rectangular donor semiconductor wafers produced in response to differing polishing pads using the equipment of FIG. 9.
Figure 13B:
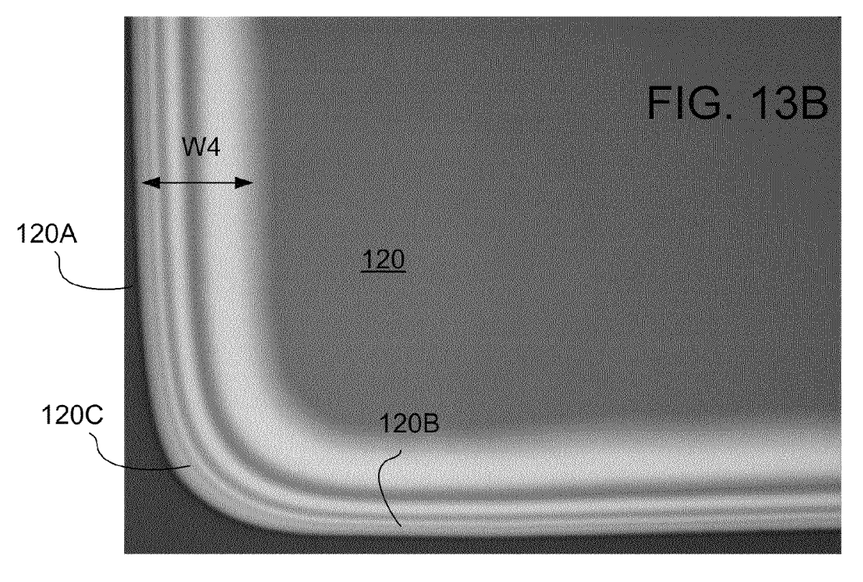

This example also includes two parts, intended to illustrate the effect that the polishing pad choice alone may have on the characteristics of the edge chamfer. In each part of the experiment, identical ramp-up, polishing, and rinsing steps were performed, the only difference being the choice of polishing pad in each part of the experiment. In the first part of the experiment a soft, compliant polishing pad was chosen (such as the SUBA 500 with compressibility in the 8-12% range and with no grooves). In the second part of the experiment a relatively incompressible, hard and grooved stock removal pad was chosen, such as the SUBA 840 polishing pad (compressibility in the 1-4% range with 21 mm×21 mm XY grooving and 1 mm groove depth). The other CMP processing parameters were held constant. The differences in the edge chamfer characteristics obtained in each part of the experiment were significant. In particular, a relatively gradual, rolling edge chamfering characteristic was obtained using the first polishing pad, as compared with a sharp characteristic using the second polishing pad. These characteristics are illustrated in FIGS. 13A and 13B, where the width W3 of the edge chamfer on the semiconductor wafer 120 in FIG. 13A is significantly wider than the width W4 of the edge chamfer on the semiconductor wafer 120 in FIG. 13B. Thus, in this example, it has been demonstrated that by changing the polishing pad 204 to a harder, less compressible surface (inclusive of grooves) the chamfer dimensions may be made much steeper and narrower.

Example 5

As discussed above, in an alternative embodiment, the slag 112 induced by the water-guided laser dicing process may be removed and a desirable chamfer obtained without a CMP process. In this regard, this prophetic example is provided, where the donor semiconductor wafer 120 is subject to flexing using any suitable technique. By way of example, the vacuum controllable chuck 206 of the apparatus 200 of FIG. 9 may be used to provide the flexion. However, any type of polishing profile may be employed, such as one or more of the CMP processes discussed above, or a non-CMP process (such as a mechanical polishing process) to preferentially polish the edges 120A, 120B, etc. of the donor semiconductor wafer 120 to achieve the chamfering.

Example 6

In this example, both mechanical flexing of the donor semiconductor wafer 120 and CMP process parameter variations may be employed to obtain desired edge chamfering and slag removal.

In this example, a stock polishing pad 204 was employed (such as a SUBA 500 pad) and the same polishing slurry may be employed as was used in Example 1. The down force was set to a level of about 3-7 psi, such as about 5 psi. The vacuum was set between about 0 and −3 psi, such as −1 psi, and the back pressure was set to between about 1-3 psi, such as about 2 psi. The vacuum set point (and potentially the back pressure set point) contribute to a desirable flex of the donor semiconductor wafer 120, where the central area of the wafer 120 is concave as viewed in FIG. 10, and the edges 120A, 120B, etc. are pronounced toward the polishing pad 204. Other process parameters used in Example 1 may be employed. The first polishing step lasted about 8 minutes, followed by a rinsing step (of similar process parameters as in prior rinsing steps). In a next or second polishing step, all process parameters remained the same except for the vacuum, which was reduced to about 0 psi. Next, a rinsing step was conducted, where the down force was significantly reduced as compared with the prior polishing steps (between about 1-3 pounds per square inch, such as about 2 psi). The vacuum remained at about 0 psi, and the back pressure was increased slightly, such as to about 2.5 psi. The rinsing step was conducted for about 60 seconds. Next, a third polishing step was carried out, where the down force was elevated to about 5 psi. The vacuum was increased back to the level of the prior polishing steps, such as to about −1 psi. The back pressure was also slightly reduced as compared to the prior rinsing step, such as back to about 2 psi. Next, another rinsing step, substantially similar to the earlier rinsing step was conducted.

Figure 14:
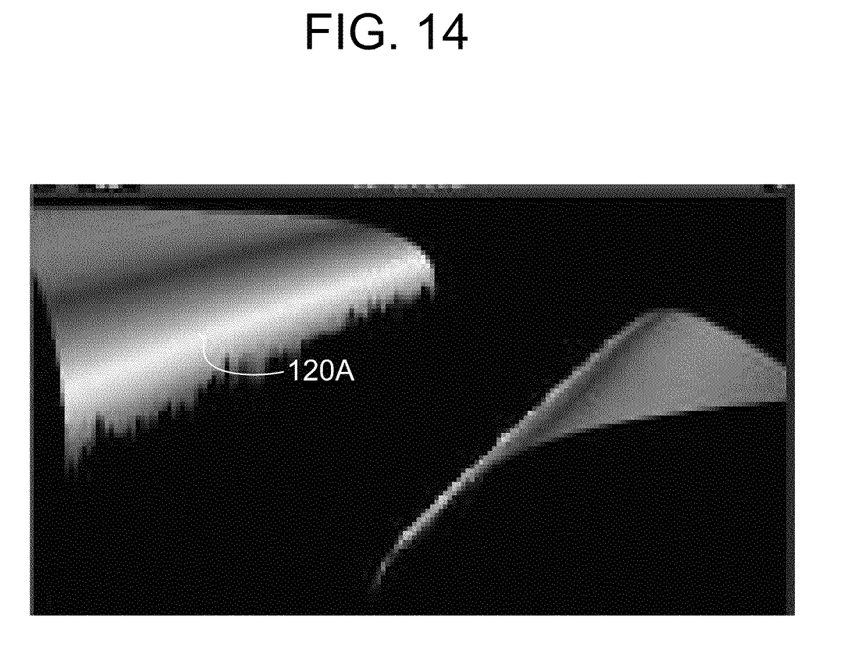
FIG. 14 illustrates desirable edge characteristics of the rectangular donor semiconductor wafer having been polished using both wafer flexing and polishing process control in connection with one or more embodiments described herein.

Reference is now made to FIG. 14, which is a white light interferometer image of the straight channel formed in the round piece of wafer stock 110 after being treated using the flexing and CMP process discussed above. As shown, the slag 112 induced by the water-guided laser dicing process is gone and a desirable chamfer is evident.

Although the embodiments herein have been described with reference to particular characteristics and instrumentalities, it is to be understood that these embodiments are merely illustrative of desirable principles and applications. It is therefore to be understood that numerous modifications may be made to the illustrative embodiments and that other arrangements may be devised without departing from the spirit and scope of the present invention as defined by the appended claims.

The invention claimed is:

1. A method of processing a rectangular silicon-on-glass donor semiconductor wafer, comprising the steps of:
    dicing the donor semiconductor wafer using water guided laser dicing, thereby leaving surface and edge portions thereof which are not chamfered and including beads of reformed, melted semiconductor material, wherein the edge portions are substantially perpendicular to the surface at an edge-surface interface thereof;
    rotating the donor semiconductor wafer;
    rotating a polishing pad, applying a polishing slurry to the polishing pad, and pressing the donor semiconductor wafer and the polishing pad together, such that the surface and edge portions of the donor semiconductor wafer are against the polishing pad; and
    selecting one or more parameters of the polishing conditions such that the edge portions of the donor semiconductor wafer are rounded.

2. The method of claim 1, wherein the one or more parameters are taken from the group consisting of: type of polishing pad, type of polishing slurry, duration of polishing, and pressure between the donor semiconductor wafer and the polishing pad.

3. A method of processing a rectangular silicon-on-glass donor semiconductor wafer, comprising the steps of:
    dicing the donor semiconductor wafer using water guided laser dicing, thereby leaving surface and edge portions thereof which are not chamfered and including beads of reformed, melted semiconductor material, wherein the edge portions are substantially perpendicular to the surface at an edge-surface interface thereof;
    flexing the donor semiconductor wafer to present a concave configuration, where the edge portions thereof are pronounced as compared to a central surface area of the surface;
    rotating the donor semiconductor wafer with respect to a polishing surface and applying pressure such that the pronounced edge portions of the donor semiconductor wafer are against the polishing surface; and
    controlling the flexion of the donor semiconductor wafer, the rotation, and the pressure such that the edge portions of the donor semiconductor wafer are rounded.

4. The method of claim 3, further comprising varying a degree of flexing in the donor semiconductor wafer during polishing to affect the edge chamfering.

5. The method of claim 3, wherein the flexing step is produced by applying a vacuum to a surface of the donor semiconductor wafer opposite to the central surface area thereof and opposite the polishing pad.

6. The method of claim 3, wherein the polishing surface includes a polishing pad and a polishing slurry.

7. The method of claim 6, further comprising selecting one or more parameters of the polishing conditions to affect the edge chamfering.

8. The method of claim 7, wherein the one or more parameters are taken from the group consisting of: type of polishing pad, type of polishing slurry, duration of polishing, and pressure between the donor semiconductor wafer and the polishing pad.

9. A method of processing a rectangular silicon-on-glass donor semiconductor wafer, comprising the steps of:
    dicing the donor semiconductor wafer using water guided laser dicing, thereby leaving surface and edge portions thereof which are not chamfered, wherein the edge portions are substantially perpendicular to the surface at an edge-surface interface thereof;
    rotating the donor semiconductor wafer;
    rotating a polishing pad, applying a polishing slurry to the polishing pad, and pressing the donor semiconductor wafer and the polishing pad together, such that the surface and edge portions of the donor semiconductor wafer are against the polishing pad; and
    selecting one or more parameters of the polishing conditions such that the edge portions of the donor semiconductor wafer are rounded.

* * * * *